United States Patent
Liaw

(10) Patent No.: US 10,535,667 B1
(45) Date of Patent: Jan. 14, 2020

(54) MEMORY ARRAY AND SEMICONDUCTOR CHIP

(71) Applicant: Taiwan Semiconductor Manufacturing Co., Ltd., Hsinchu (TW)

(72) Inventor: Jhon-Jhy Liaw, Hsinchu County (TW)

(73) Assignee: Taiwan Semiconductor Manufacturing Co., Ltd., Hsinchu (TW)

( * ) Notice: Subject to any disclaimer, the term of this patent is extended or adjusted under 35 U.S.C. 154(b) by 0 days.

(21) Appl. No.: 16/125,786

(22) Filed: Sep. 10, 2018

Related U.S. Application Data

(60) Provisional application No. 62/712,197, filed on Jul. 30, 2018.

(51) Int. Cl.
*G11C 11/00* (2006.01)
*H01L 27/11* (2006.01)
*G11C 11/412* (2006.01)

(52) U.S. Cl.
CPC ........ *H01L 27/1104* (2013.01); *G11C 11/412* (2013.01)

(58) Field of Classification Search
CPC ..... G11C 11/412; G11C 15/04; G11C 11/417; G11C 11/419; G11C 16/24; G11C 11/404; G11C 11/4125; G11C 5/063; G11C 5/143; G11C 7/02; H01L 27/11; H01L 27/105; H01L 23/522; H01L 23/528; H01L 27/02; H01L 29/417; H01L 21/02; H01L 21/265; H01L 21/311; H01L 21/768; H01L 21/8238; H01L 27/32

USPC ............. 365/154, 105, 175, 189.09, 189.11, 365/189.19, 230.05, 189.04, 189.15, 226, 365/229

See application file for complete search history.

(56) References Cited

U.S. PATENT DOCUMENTS

| | | |
|---|---|---|
| 8,625,334 B2 | 1/2014 | Liaw |
| 8,796,666 B1 | 8/2014 | Huang et al. |
| 8,815,712 B2 | 8/2014 | Wan et al. |
| 8,836,016 B2 | 9/2014 | Wu et al. |
| 8,841,701 B2 | 9/2014 | Lin et al. |
| 8,847,293 B2 | 9/2014 | Lee et al. |
| 8,853,025 B2 | 10/2014 | Zhang et al. |

(Continued)

*Primary Examiner* — Thong Q Le
(74) *Attorney, Agent, or Firm* — JCIPRNET

(57) ABSTRACT

A memory array and a semiconductor chip are provided. The memory array includes memory cells, each includes: first and second pull-up transistors, first and second pull-down transistors, and first and second pass-gate transistors. A source/drain of the first pull-up transistor is coupled to a source/drain of the first pull-down transistor. A source/drain of the second pull-up transistor is coupled to a source/drain of the second pull-down transistor. Gates of the second pull-up and pull-down transistors are coupled to the first node. Gates of the first pull-up and pull-down transistors are coupled to the second node. The first and second pass-gate transistors are respectively coupled to the first and second nodes. The first and second pull-up transistors respectively include a first active structure having a bottom portion including a strained semiconductor material and a top portion including an unstrained semiconductor material. The first active structures continuously extend across the memory array.

20 Claims, 6 Drawing Sheets

(56) References Cited

U.S. PATENT DOCUMENTS

| | | |
|---|---|---|
| 8,879,305 B2 | 11/2014 | Liaw |
| 8,962,400 B2 | 2/2015 | Tsai et al. |
| 8,963,258 B2 | 2/2015 | Yu et al. |
| 9,093,514 B2 | 7/2015 | Tsai et al. |
| 9,093,530 B2 | 7/2015 | Huang et al. |
| 9,171,929 B2 | 10/2015 | Lee et al. |
| 9,214,555 B2 | 12/2015 | Oxland et al. |
| 9,236,267 B2 | 1/2016 | De et al. |
| 9,245,805 B2 | 1/2016 | Yeh et al. |
| 9,520,482 B1 | 12/2016 | Chang et al. |
| 9,548,303 B2 | 1/2017 | Lee et al. |
| 9,576,814 B2 | 2/2017 | Wu et al. |
| 2016/0190141 A1* | 6/2016 | Lee .................. H01L 27/1104 |

* cited by examiner

MEMORY ARRAY AND SEMICONDUCTOR CHIP

CROSS-REFERENCE TO RELATED APPLICATION

This application claims the priority benefits of U.S. provisional application Ser. No. 62/712,197, filed on Jul. 30, 2018. The entirety of the above-mentioned patent application is hereby incorporated by reference herein and made a part of this specification.

BACKGROUND

Static random access memory (SRAM) has been widely used as a representative memory for logic integrated circuits, since SRAM array operates fast as logic circuits operate, and consumes a significantly low power at standby mode. Recent advances in fin field effect transistor (finFET) have made advanced SRAM cells using finFETs possible. However, some of the fin structures in a SRAM array are not continuously extended across the SRAM array, and may be interrupted by isolation structures. As such, a length of oxide diffusion (LOD) effect may be occurred on the transistors adjacent to the isolation structures, and performance of these transistors would be affected.

BRIEF DESCRIPTION OF THE DRAWINGS

Aspects of the present disclosure are best understood from the following detailed description when read with the accompanying figures. It is noted that, in accordance with the standard practice in the industry, various features are not drawn to scale. In fact, the dimensions of the various features may be arbitrarily increased or reduced for clarity of discussion.

DETAILED DESCRIPTION

Figure 1:
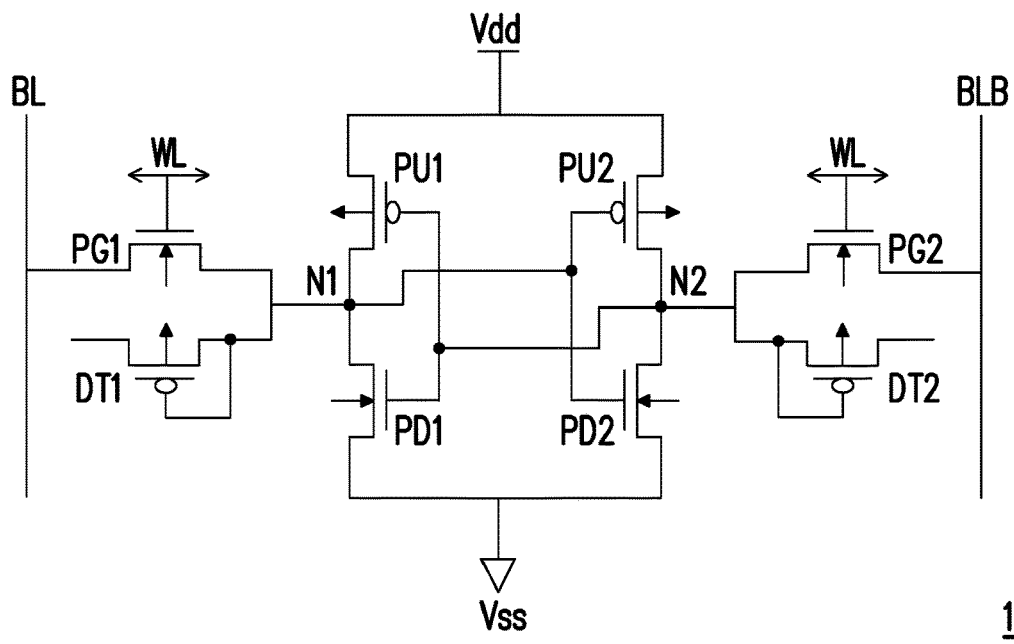
FIG. 1 is a circuit diagram of a memory cell in accordance with some embodiments.

The following disclosure provides many different embodiments or examples, for implementing different features of the provided subject matter. Specific examples of components and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

Further, spatially relative terms, such as "beneath," "below," "lower," "above," "upper" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly.

It should be appreciated that the following embodiment(s) of the present disclosure provides applicable concepts that can be embodied in a wide variety of specific contexts. The embodiments are intended to provide further explanations but are not used to limit the scope of the present disclosure.

Embodiments will be described with respect to a specific context, namely a memory cell, such as a static random access memory (SRAM) cell. Other embodiments may also be applied, however, to other circuits and layouts. Throughout the various views and illustrative embodiments, like reference numbers are used to designate like elements.

In the following descriptions, the fins may be patterned by any suitable method. For example, the fins may be patterned using one or more photolithography processes, including double-patterning or multi-patterning processes. Generally, double-patterning or multi-patterning processes combine photolithography and self-aligned processes, allowing patterns to be created that have, for example, pitches smaller than what is otherwise obtainable using a single, direct photolithography process. For example, in one embodiment, a sacrificial layer is formed over a substrate and patterned using a photolithography process. Spacers are formed alongside the patterned sacrificial layer using a self-aligned process. The sacrificial layer is then removed, and the remaining spacers may then be used to pattern the fins.

FIG. 1 is a circuit diagram of a memory cell 10 in accordance with some embodiments.

Referring to FIG. 1, in some embodiments, the memory cell 10 is a SRAM cell with single port. In other embodiments, the memory cell may be configured to be a dual port SRAM cell. In the embodiments depicted in FIG. 1, the memory cell 10 includes a first pull-up transistor PU1, a first pull-down transistor PD1, a second pull-up transistor PU2, a second pull-down transistor PD2, a first pass-gate transistor PG1 and a second pass-gate transistor PG2. In some embodiments, the first pull-up transistor PU1 and the second pull-up transistor PU2 are field effect transistors (FETs) of a first conductive type, while the first pull-down transistor PD1, the second pull-down transistor PD2, the first pass-gate transistor PG1 and the second pass-gate transistor PG2 are FETs of a second conductive type. The first conductive type is complementary to the second conductive type. For instance, the first conductive type is p-type, and the second conductive type is n-type. In addition, the FET may be a finFET having a channel region in a fin-shaped active structure.

In some embodiments, the drains of the first pull-up transistor PU1 and the first pull-down transistor PD1 are electrically coupled together at a first node N1, and the drains of the second pull-up transistor PU2 and the second pull-down transistor PD2 are electrically coupled together at a second node N2. The first pull-up transistor PU1 and the first pull-down transistor PD1 are cross-coupled with the second pull-up transistor PU2 and the second pull-down transistor PD2 to form a data latch. The gates of the first pull-up transistor PU1 and the first pull-down transistor PD1 are electrically coupled together and to the second node N2, and the gates of the second pull-up transistor PU2 and the second pull-down transistor PD2 are electrically coupled together and to the first node N1. The sources of the first pull-up transistor PU1 and the second pull-up transistor PU2 are electrically coupled to a power voltage Vdd, and the sources of the first pull-down transistor PD1 and the second pull-down transistor PD2 are electrically coupled to a reference voltage Vss.

The first node N1 of the data latch is electrically coupled to a bit line BL through the first pass-gate transistor PG1, and the second node N2 is electrically coupled to a complementary bit line BLB through the second pass-gate transistor PG2. The first and second nodes N1 and N2 are complementary nodes that are often at opposite logic levels (i.e., logic high and logic low levels). In some embodiments, the drain of the first pass-gate transistor PG1 is electrically coupled to the first node N1, and the drain of the second pass-gate transistor PG2 is electrically coupled to the second node N2. In addition, the gates of the first pass-gate transistor PG1 and the second pass-gate transistor PG2 are electrically coupled to a word line WL.

In some embodiments, the memory cell 10 further includes a first dummy transistor DT1 and a second dummy transistor DT2. The drain of the first dummy transistor DT1 is electrically coupled to the first node N1, and the drain of the second dummy transistor DT2 is electrically coupled to the second node N2. In some embodiments, the gate and source of the first dummy transistor DT1 are electrically coupled together, and the gate and source of the second dummy transistor DT2 are electrically coupled together. The sources of the first and second dummy transistors DT1 and DT2 may be electrically coupled to a dummy transistor in an adjacent memory cell respectively, as will be depicted in FIG. 2A.

Figure 1A:
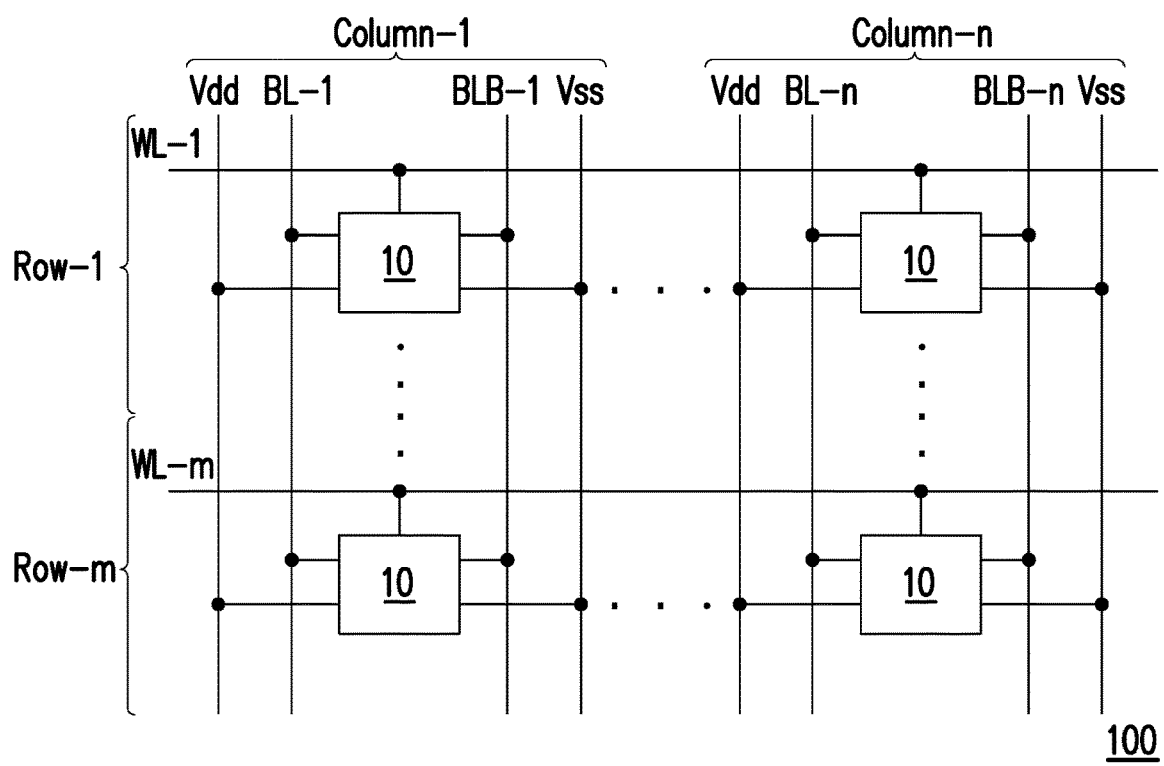
FIG. 1A is a schematic diagram illustrating a memory array including a plurality of the memory cell depicted in FIG. 1.

FIG. 1A is a schematic diagram illustrating a memory array 100 including a plurality of the memory cell 10 depicted in FIG. 1.

Referring to FIG. 1 and FIG. 1A, the memory array 100 includes m×n number of memory cells 10, with m number of memory cells 10 in each column and n number of memory cells 10 in each row. Each column has a bit line BL-n and a complementary bit line BLB-n, and each row has a word line WL-m. A selection of a word line and a bit line will read from or write to a memory cell 10 at the intersection of the selected word line and bit line. In some embodiments, each column has a power line Vdd and a reference line Vss. In other embodiments, the power line Vdd and the reference line Vss may be in each row or in a combination of a row and a column.

Figure 2:
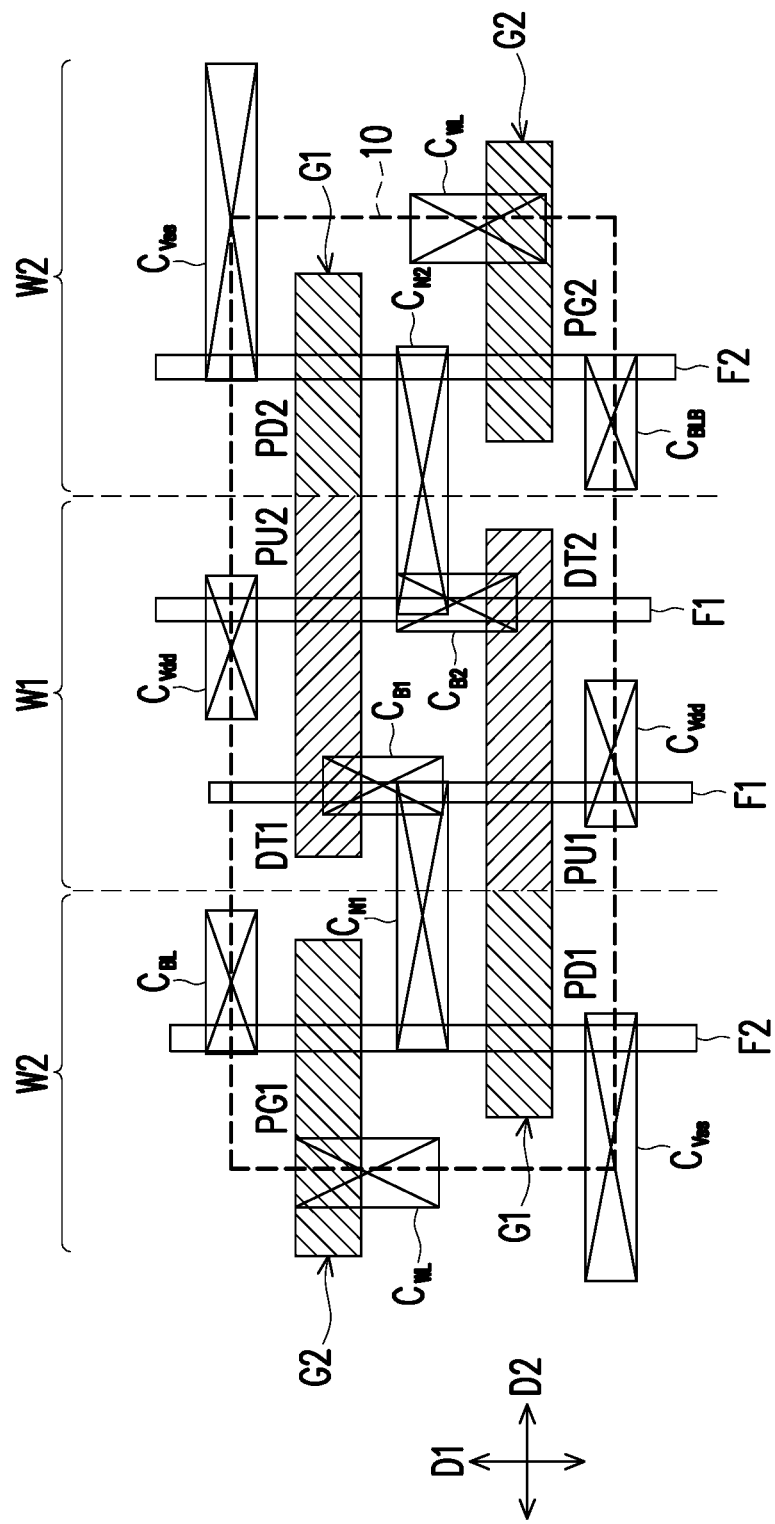
FIG. 2 is an exemplary layout of the memory cell depicted in FIG. 1.

FIG. 2 is an exemplary layout of the memory cell 10 depicted in FIG. 1.

Referring to FIG. 2, four active structures extend along a first direction D1, and are arranged along a second direction D2 that is intersected with the first direction D1. In some embodiments, the first direction D1 is perpendicular to the second direction D2. Four gate lines of the various transistors are formed over the active structures and extended along the second direction D2, and are arranged along the first direction D1. A vicinity of an intersection of each active structure and one of the gate lines forms one of the transistors. A portion of each active structure overlapped by one of the gate lines can be functioned as a channel region of the corresponding transistor, and source and drain regions may be formed at opposite sides of the channel region across the corresponding gate line.

The first pull-up transistor PU1, the second pull-up transistor PU2, the first dummy transistor DT1 and the second dummy transistor DT2 are the transistors of the first conductive type (e.g., p-type), and formed within a first well region W1 of the second conductive type (e.g., n-type). The first pull-down transistor PD1 and the first pass-gate transistor PG1 are the transistors of the second conductive type (e.g., n-type), and are formed in a second well region W2 of the first conductive type (e.g., p-type). Similarly, the second pull-down transistor PD2 and the second pass-gate transistor PG2 are the transistors of the second conductive type (e.g., n-type), and are formed in another second well region W2 of the first conductive type (e.g., p-type).

Two of first active structures F1 are disposed within the first well region W1, and extended along the first direction D1. The first pull-up transistor PU1 and the first dummy transistor DT1 may share one of the first active structures F1, and the second pull-up transistor PU2 and the second dummy transistor DT2 may share the other one of the first active structures F1. On the other hand, a second active structure F2 is formed in one of the second well regions W2, and shared by the first pull-down transistor PD1 and the first pass-gate transistor PG1. Similarly, another second active structure F2 is formed in the other one of the second well regions W2, and shared by the second pull-down transistor PD2 and the second pass-gate transistor PG2. In some embodiments, the first and second active structures F1 and F2 are fin structures, and located over a substrate, as will be described.

A gate line G1 is shared by the first pull-down transistor PD1, the first pull-up transistor PU1 and the second dummy transistor DT2, and extends along the second direction D2. Similarly, another gate line G1 is shared by the second pull-down transistor PD2, the second pull-up transistor PU2 and the first dummy transistor DT1, and extends along the second direction D2. In addition, a gate line G2 for the first pass-gate transistor PG1 extends beyond a cell boundary, so that the gate line G2 can be shared by adjacent memory cells 10. Similarly, another gate line G2 for the second pass-gate transistor PG2 extends beyond a cell boundary to be shared by adjacent memory cells 10.

A word line contact $C_{WL}$ is electrically coupled to the gate of the first pass-gate transistor PG1, and another word line contact $C_{WL}$ is electrically coupled to the gate of the second pass-gate transistor PG2. A bit line contact $C_{BL}$ is electrically coupled to the source of the first pass-gate transistor PG1, and a complementary bit line contact $C_{BLB}$ is electrically coupled to the source of the second pass-gate transistor PG2. A power contact $C_{Vdd}$ is electrically coupled to the source of the first pull-up transistor PU1, and another power contact $C_{Vdd}$ is electrically coupled to the source of the second pull-up transistor PU2. A ground contact $C_{Vss}$ is electrically coupled to the source of the first pull-down transistor PD1, and another ground contact $C_{Vss}$ is electrically coupled to the source of the second pull-down transistor PD2. A first node contact $C_{N1}$ electrically couples together the drains of the first pass-gate transistor PG1, the first dummy transistor DT1, the first pull-up transistor PU1 and the first pull-down transistor PD1. A second node contact $C_{N2}$ electrically couples together the drains of the second pass-gate transistor PG2, the second dummy transistor DT2, the second pull-up transistor PU2 and the second pull-down transistor PD2. In some embodiments, a butted contact $C_{B1}$ electrically couples together the drain and gate of the first dummy transistor DT1, and a butted contact $C_{B2}$ electrically couples the drain and gate of the second dummy transistor DT2.

In alternative embodiments, at least one of the various transistors has two second active structures F2 (i.e., a transistor with double pitch). Other embodiments contemplate various different pitches for the various transistors. In addition, configurations regarding source and drain of each of the various transistors can be reversed.

Figure 2A:
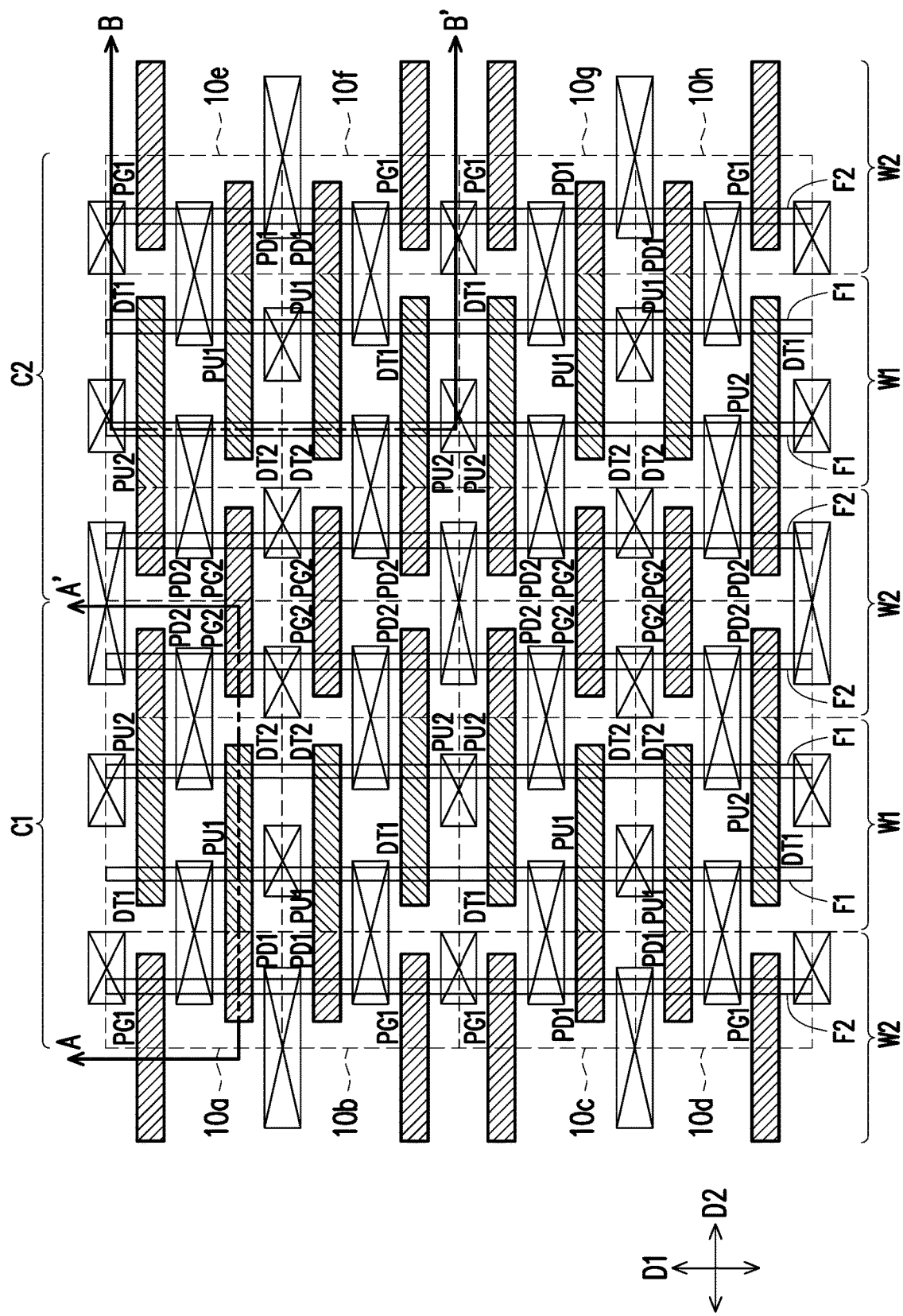
FIG. 2A is an exemplary layout of 4×2 memory array of the memory cells each depicted in FIG. 2.

FIG. 2A is an exemplary layout of 4×2 memory array of the memory cells 10a through 10h each depicted in FIG. 2 as the memory cell 10. Some of the various contact components (e.g., the butted contacts $C_{B1}$ and $C_{B2}$) shown in FIG. 2 are omitted in FIG. 2A for simplicity.

Referring to FIG. 2 and FIG. 2A, the memory cells 10a through 10d are arranged in a first column C1, and the memory cells 10e through 10h are arranged in a second column C2. In some embodiments, adjacent memory cells in the memory array are mirror images with respect to a border between the adjacent memory cells. Each active structure (i.e., each first active structure F1 and each second active structure F2) continuously extends through a column along the first direction D1. As such, each active structure continuously may extend across the memory array along the first direction D1.

For instance, the first active structure F1 shared by the first pull-up transistor PU1 and the first dummy transistor DT1 in the memory cell 10a further extends through the memory cells 10b 10c and 10d, as the active structure for the first pull-up transistors PU1 and the first dummy transistors DT1 in the memory cells 10b, 10c and 10d. In this configuration, the drains of the first dummy transistors DT1 in adjacent memory cells are electrically coupled together. Similarly, the first active structure F1 shared by the second pull-up transistor PU2 and the second dummy transistor DT2 in the memory cell 10e further extends through the memory cells 10f, 10g and 10h, as the active structure for the first pull-up transistors PU1 and the first dummy transistors DT1 in the memory cells 10f, 10g and 10h. In addition, the drains of the second dummy transistors DT2 in adjacent memory cells are electrically coupled together. On the other hand, the second active structure F2 shared by the first pull-down transistor PD1 and the first pass-gate transistor PG1 in the memory cell 10a further extends through the memory cells 10b, 10c and 10d, as the active structure of the first pull-down transistors PD1 and the first pass-gate transistors PG1 in the memory cells 10b through 10d. Similarly, the second active structure F2 shared by the second pull-down transistor PD2 and the second pass-gate transistor PG2 in the memory cell 10e further extends through the memory cells 10f, 10g and 10h, as the active structure of the second pull-down transistors PD2 and the second pass-gate transistors PG2 in the memory cells 10f through 10h.

In alternative embodiments, each active structure may continuously extend through multiple but less than all of the memory cells in a column.

By having active structures continuously extend across the memory array without being interrupted by isolation structure(s), performance of the various transistors in the memory array can be avoided from being affected by a length of oxide diffusion (LOD) effect or a poor control of an end shrink of the active structures, and an additional patterning process on the active structures for forming the isolation structure(s) can be omitted. Moreover, an operating stability of the memory array and a memory cell matching can be improved, as well as a uniformity of the profile of the active structures. In addition, in comparison to discontinuous active structures, the continuously extended active structures in the present disclosure have a lower resistance, thus a soft error rate (SER) and latch up performance can be improved. Furthermore, a trapping frequency of the active structures can be expanded, which is helpful for saving an area of the memory array.

Figure 3A:
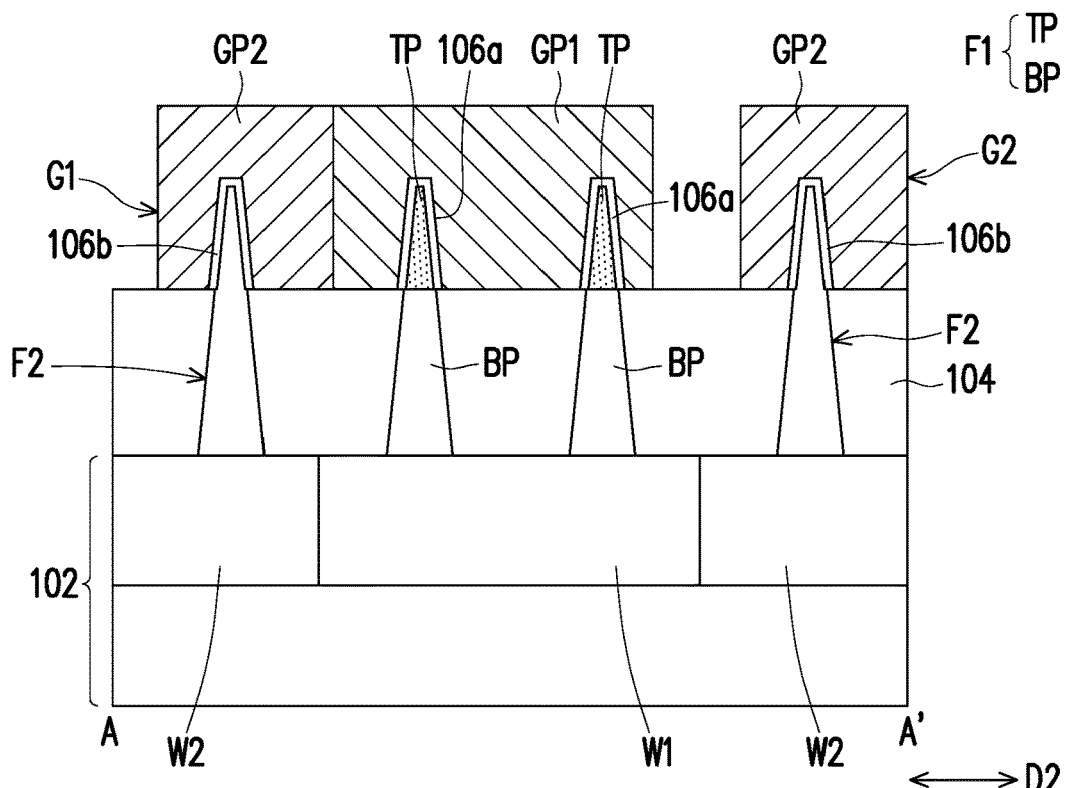
FIG. 3A is an exemplary cross-sectional view along an A-A' line depicted in FIG. 2A in accordance with some embodiments.
Figure 3B:
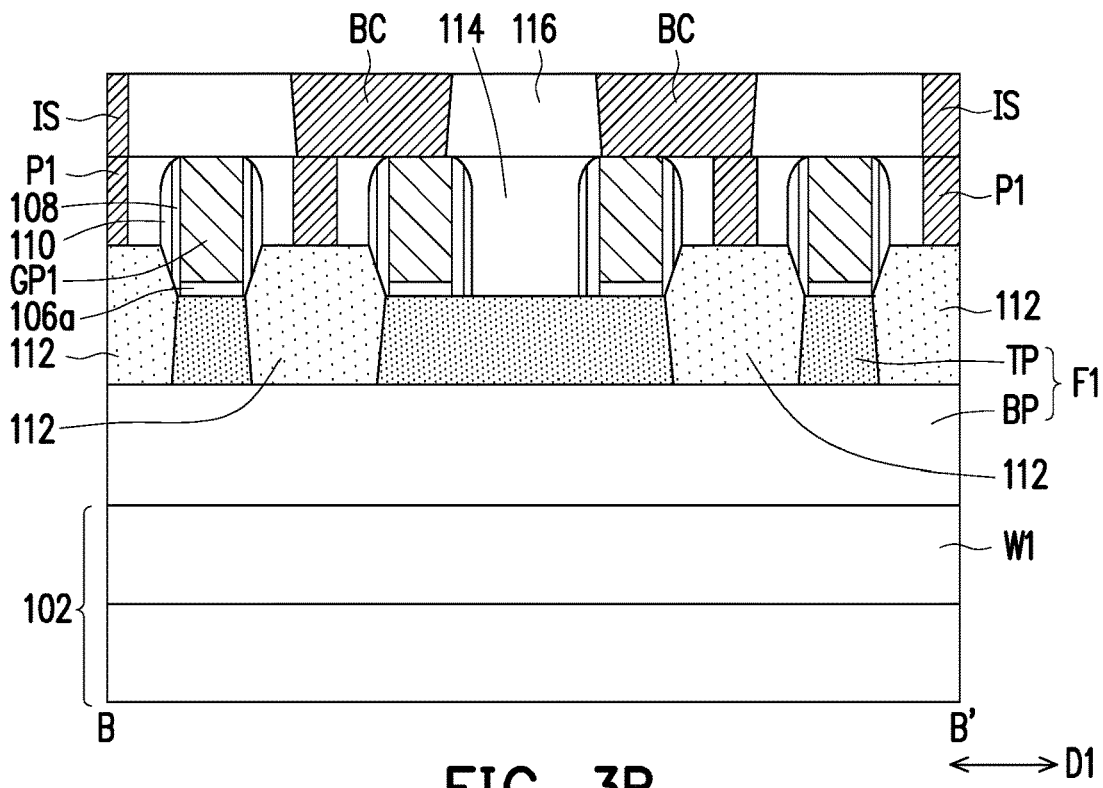
FIG. 3B is an exemplary cross-sectional view along a B-B' line depicted in FIG. 2A in accordance with some embodiments.

FIG. 3A is an exemplary cross-sectional view along an A-A' line depicted in FIG. 2 in accordance with some embodiments. FIG. 3B is an exemplary cross-sectional view along a B-B' line depicted in FIG. 2A in accordance with some embodiments. For simplicity, the interlayer dielectric layers 114 and 116, the interconnection structure IS and the butted contacts BC are omitted in FIG. 3A.

Referring to FIG. 2 and FIG. 3A, the first active structures F1 and the second active structures F2 are formed on a substrate 102 having the first well region W1 and the second well regions W2 therein. The substrate 102 may be a semiconductor wafer, such as a Si wafer. The first active structures F1 are formed within the first well region W1, whereas the second active structures F2 are respectively formed within the second well regions W2. Each of the first active structures F1 has a bottom portion BP and a top portion TP formed over the bottom portion BP. The top portion TP is made of a strained semiconductor material, and the bottom portion BP is made of an unstrained semiconductor material. For instance, the strained semiconductor material includes SiGe, and an atomic concentration of Ge ranges from 5 at % to 34 at %. In addition, the unstrained semiconductor material may include Si. The first active structures F1 and the first well region W1 have the same conductive type (i.e., the second conductive type, such as n-type). In some embodiments, a doping concentration of the bottom portions BP of the first active structures F1 is substantially equal to a doping concentration of the first well region W1. In these embodiments, a doping concentration of the top portions TP may be higher than, equal to or lower than the doping concentration of the bottom portions BP and the first well region W1. For instance, the doping concentration of the bottom portions BP of the first active structures F1 and the first well region W1 ranges from $10^{17}$/cm$^3$ to $10^{19}$/cm$^3$, and the doping concentration of the top portions TP of the first active structures F1 ranges from $10^{16}$/cm$^3$ to $10^{18}$/cm$^3$. On the other hand, the second active structures F2 are made of an unstrained semiconductor material, such as Si. The second active structures F2 and the second well region W2 have the same conductive type (i.e., the first conductive type, such as p-type). In some embodiments, a doping concentration of the second active structures F2 is substantially equal to a doping concentration of the second well region W2, such as in a range from $10^{17}$/cm$^3$ to $10^{19}$/cm$^3$.

In some embodiments, a height of the first active structure F1 and the second active structure F2 measured from a surface of the substrate 102 to a top surface of the first active structure F1 or a top surface of the second active structure F2 ranges from 60 nm to 290 nm. In these embodiments, a height of the bottom portion BP of the first active structure F1 ranges from 30 nm to 200 nm, and a height of the top portion TP of the first active structure F1 ranges from 30 nm to 90 nm. An isolation structure 104 may be disposed around each of the active structures. In some embodiments, a top surface of the isolation structure 104 may be substantially aligned with an interface between the bottom portion BP and the top portion TP of the first active structure F1.

Gate patterns GP1 and GP2 are formed over the isolation structure 104. The gate pattern GP1 covers a top surface and sidewalls of the first active structure F1, and the gate pattern GP2 covers a top surface and sidewalls of the second active structure F2. The gate pattern GP2 for the first pull-down transistor PD1 and the gate patterns GP1 for the first pull up transistor PU1 and the second dummy transistors DT2 are connected with each other to form one of the gate lines G1. In addition, the gate pattern GP2 for the second pass-gate transistor PG2 is a portion of one of the gate lines G2. In some embodiments, the gate patterns GP1 are made of a "first conductive type metal", which is referred as a metal material having a work function close to a top edge of a valence band of a first conductive type (e.g., p-type) semiconductor material in the top portion TP of the first active structure F1. For instance, a material of the top portion TP of the first active structure F1 is SiGe, and the first conductive type metal in the gate pattern GP1 includes multiple metal stack and selected from a group consisting of TiN, TaN, TiAl, TiAlN, TaN, TaAl, TaAlN, TaAlC, TaCN, Al, W, or combinations thereof. On the other hand, the gate patterns GP2 are made of a "second conductive type metal", which is referred as a metal material having a work function close to a bottom edge of a conduction band of a second conductive type (e.g., n-type) semiconductor material in the second active structure F2. For instance, a material of the second active structure F2 is Si, and the second conductive type metal in the gate pattern GP2 includes multiple metal stack and selected from a group consisting of TiN, TaN, TiAl, TiAlN, TaN, TaAl, TaAlN, TaAlC, TaCN, Al, W, or combinations thereof. In some embodiments, the first pull-up transistor PU1 and the second dummy transistor DT2 are p-type transistors, and the first pull-down transistor PD1 and the second pass-gate transistor PG2 are n-type transistors. In these embodiments, a work function of the gate patterns GP2 for the first pull-down transistor PD1 and the second pass-gate transistor PG2 is higher than a work function of the gate patterns GP1 for the first pull-up transistor PU1 and the second dummy transistor DT2.

Gate dielectric patterns 106a are respectively formed between top portions TP of the first active structures F1 and the overlying gate patterns GP1. Similarly, gate dielectric patterns 106b are respectively formed between portions of the second active structures F2 that are protruding from the isolation structure 104 and the overlying gate patterns GP2. In some embodiments, a material of the gate dielectric patterns 106a and the gate dielectric patterns 106b includes silicon oxide, silicon nitride, a high-k dielectric material (of which dielectric constant is greater than 4) or a combination thereof. In some embodiments, a formation method of the gate dielectric patterns 106a and 106b includes performing an oxidation process on the first and second active structures F1 and F2. Moreover, in some embodiments, a barrier layer and/or a work function layer (both not shown) may be further disposed between the gate dielectric pattern and the overlying gate pattern.

By applying a strained semiconductor material in the top portions of the first active structures, a field effect mobility of the carriers in the transistors having channel regions in the first active structures can be raised. As such, a driving ability of these transistors can be improved. Furthermore, regarding the generation mechanism of the strain, continuity of the active structures having the strained portion is even more important than the active structures without a strained portion.

Referring to FIG. 2 and FIG. 3B, one of the first active structures F1 extending along the first direction D1 is shown in FIG. 3B. A section of this first active structure F1 is shared by two second dummy transistors DT2 and two second pull-up transistors PU2 at opposite sides of the second dummy transistors DT2. The second dummy transistors DT2 and the second pull-up transistors PU2 each has a gate structure GS including the gate pattern GP1, the gate dielectric pattern 106a, a first sidewall spacer 108 and a second sidewall spacer 110. The gate dielectric pattern 106a is disposed between the top portion TP of the first active structure F1 and the gate pattern GP1. The first and second sidewall spacers 108 and 110 are sequentially formed at a sidewall of the gate pattern GP1.

Each of the second pull-up transistors PU2 of the first conductive type (e.g., p-type) includes two source/drain regions 112 having the first conductive type (e.g., p-type). The source/drain regions 112 are disposed at opposite sides of the gate structure GS in the top portion TP of the first active structure F1. In some embodiments, openings (not shown) may be firstly formed at opposite sides of the gate structure GS in the top portion TP of the first active structure F1, and then the source/drain regions 112 are formed in these openings via, for example, an epitaxial process. In these embodiments, the source/drain regions 112 may protrude from a top surface of the first active structure F1, and may have a diamond shape, a circular shape, a rectangular shape or the like. Moreover, in these embodiments, the bottom portion BP of the first active structure F1 is continuous along the first direction D1, whereas the top portion TP of the first active structure F1 may be discontinuous along the same direction. The source/drain regions 112 of the second pull-up transistor PU2 may each located between adjacent segments of the top portion TP of the first active structure F1. In some embodiments, a material of the source/drain regions 112 for the transistors of the first conductive type (e.g., p-type), such as the first and second pull-up transistors PU1 and PU2, may include SiGe. In some embodiments of which the top portion TP of the first active structure F1 and the source/drain regions 112 are both made of SiGe, a Ge atomic percentage in the source/drain regions 112 is higher than a Ge atomic percentage in the top portion TP of the first active structure F1. For instance, the Ge atomic percentage in the source/drain regions 112 ranges from 35% to 75%, and the Ge atomic percentage in the top portion TP of the first active structure F1 ranges from 5% to 34%. In alternative embodiments, a material of the source/drain region 112 may include SiP, SiC, SiPC, SiAs, Si or a combination thereof.

In some embodiments, a doping concentration of the source/drain regions 112 is higher than a doping concentration of the top portion TP of the first active structure F1. For instance, the source/drain regions 112 are doped to have the first conductive type (p-type) with a doping concentration ranged from $10^{20}$/cm$^3$ to $10^{22}$/cm$^3$. The top portion TP of the first active structure F1 may be doped to have the second conductive type (n-type) with a doping concentration ranged from $10^{16}$/cm$^3$ to $10^{18}$/cm$^3$. In addition, a width of the source/drain region 112 may be greater than each of the first and second active structures F1 and F2. Furthermore, a silicide layer (not shown) may be formed on each of the source/drain regions 112.

In some embodiments, the second dummy transistor DT2 shares one of the source/drain region 112 with adjacent second pull-up transistor PU2. In these embodiments, a source/drain region is absent in between adjacent second dummy transistors DT2 in adjacent memory cells, such that the top portion TP of the first active structure F1 is continuous between the two adjacent second dummy transistors DT2. In some embodiments, a first interlayer dielectric layer 114 and a second interlayer dielectric layer 116 are sequentially formed over the first active structure F1. A top surface of the first interlayer dielectric layer 114 may be substantially aligned with top surfaces of the gate structures GS. Contact plugs P1 are disposed in the first interlayer dielectric layer 114, and are electrically connected with the source/drain regions 112 for the second pull-up transistors PU2 and the second dummy transistors DT2. The second interlayer dielectric layer 116 is disposed over the first interlayer dielectric layer 114. Interconnection structure IS are disposed in the second interlayer dielectric layer 114, and are electrically connected with the contact plugs P1, respectively. In addition, butted contacts BC are disposed in the second interlayer dielectric layer 116. Each butted contact BC electrically connects the gate structure GS and the source/drain region 112 of the second dummy transistor DT2.

A cross-sectional view along the other first active structure F1 is similar to the configuration shown in FIG. 3B, and a description thereof is omitted for simplicity. Similar to the first and second pull-up transistors PU1 and PU2, the first and second pull-down transistors PD1 and PD2 and the first and second pass-gate transistors PG1 and PG2 each has a gate structure and two source/drain regions in the corresponding second active structure F2. Adjacent transistors may share the same source/drain region, in order to save a footprint of the memory array.

Figure 4:
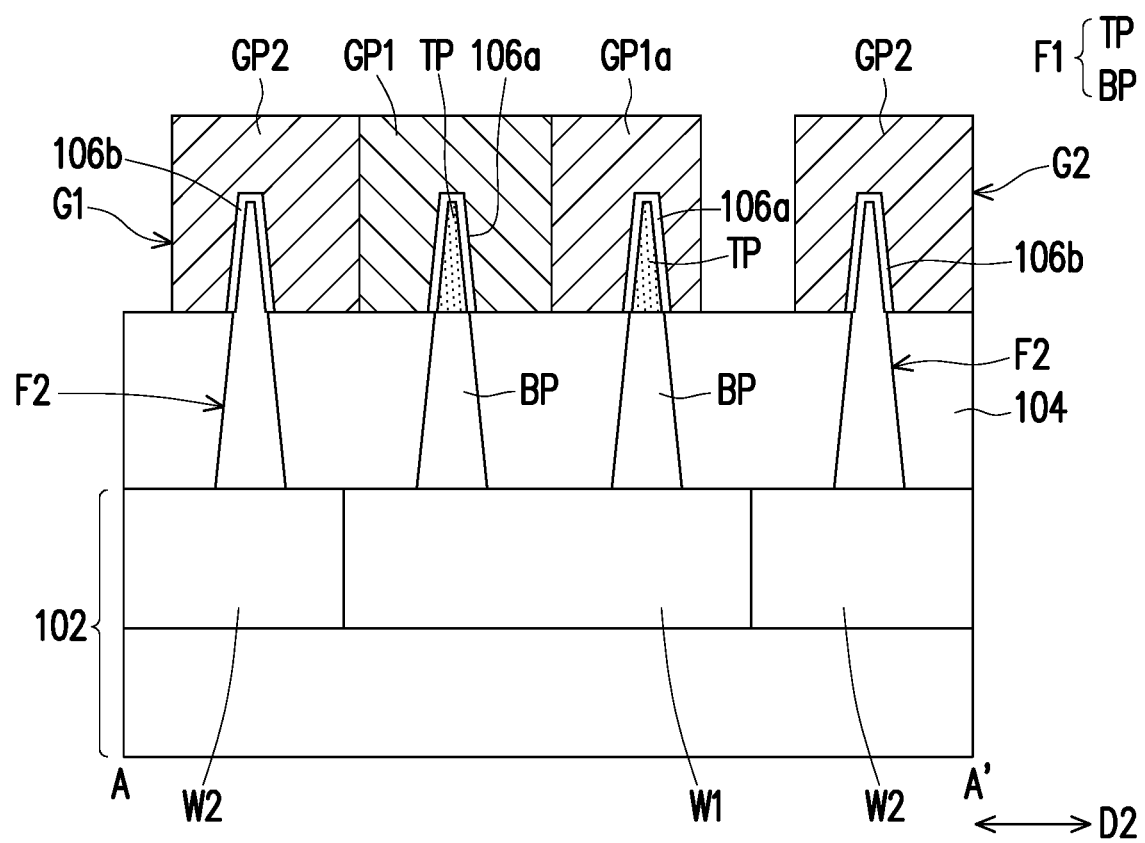
FIG. 4 is another exemplary cross-sectional view along a A-A' line depicted in FIG. 2A in accordance with some embodiments.

FIG. 4 is another exemplary cross-sectional view along a A-A' line depicted in FIG. 2A in accordance with some embodiments. The cross-sectional view shown in FIG. 4 is similar to the cross-sectional view shown in FIG. 3A, only differences therebetween will be discussed, the same or the similar parts will be omitted for simplicity.

Referring to FIG. 4, the second dummy transistor DT2 of the first conductive type (e.g., p-type) has a gate pattern PG1a made of the "second conductive type (e.g., n-type) metal material". In these embodiments, the second dummy transistor DT2 (of the first conductive type), the first pull-down transistor PD1 (of the second conductive type) and the second pass-gate transistor PG2 (of the second conductive type) each has a gate pattern made of the "second conductive type metal material", whereas the first pull-up transistor PU1 of the first conductive type has the gate pattern PG2 made of the "first conductive type metal material". In some embodiments, the first conductive type is p-type, and the second conductive type is n-type. As such, a work function of the gate pattern GP1a for the second dummy transistor DT2 is higher than the work function of the gate pattern GP1 for the first pull-up transistor PU1. In addition, the work function of the gate pattern GP1a for the second dummy transistor DT2 may be substantially equal to the work function of the gate patterns GP2 for the first pull-down transistor PD1 and the second pass-gate transistor PG2. In these embodiments, a material of the gate pattern GP1a may be the same as the material of the gate pattern GP1.

In other embodiments, the first conductive type is n-type, and the second conductive type is p-type. In these embodiments, a work function of the gate pattern GP1a for the second dummy transistor DT2 is lower than the work function of the work function of the gate pattern GP2 for the first pull-up transistor PU1, and substantially equal to the work function of the gate patterns GP2 for the first pull-down transistor PD1 and the second pass-gate transistor PG2. Furthermore, although it is not depicted, the first dummy transistor DT1 of the first conductive type (p-type) may have a gate pattern made of the "second conductive type (e.g., n-type) metal material" as well.

If the first and second dummy transistors DT1 and DT2 are p-type transistors, disposing a gate pattern with a work function away from (e.g., higher than) a top edge of a valence band of a semiconductor material in the channel region of the p-type transistors (e.g., the first and second dummy transistors DT1 and DT2) can raise a threshold voltage of the p-type transistors. Similarly, if the first and second dummy transistors DT1 and DT2 are n-type transistors, disposing a gate pattern with a work function away from (e.g., lower than) a bottom edge of a conduction band of a semiconductor material in the channel region of the n-type transistor can raise a threshold voltage of the n-type transistor as well. In some embodiments, the threshold voltage of the dummy transistors can be raised by 50 mV or more. As such, even during switching of the first and second nodes N1 and N2 (e.g., from low to high and vice versa), the first and second dummy transistors DT1 and DT2 can be avoided from being turned on. Therefore, a cross-talk between adjacent first dummy transistors DT1 (or adjacent second dummy transistors DT2) in adjacent memory cells can be avoided.

Figure 5:
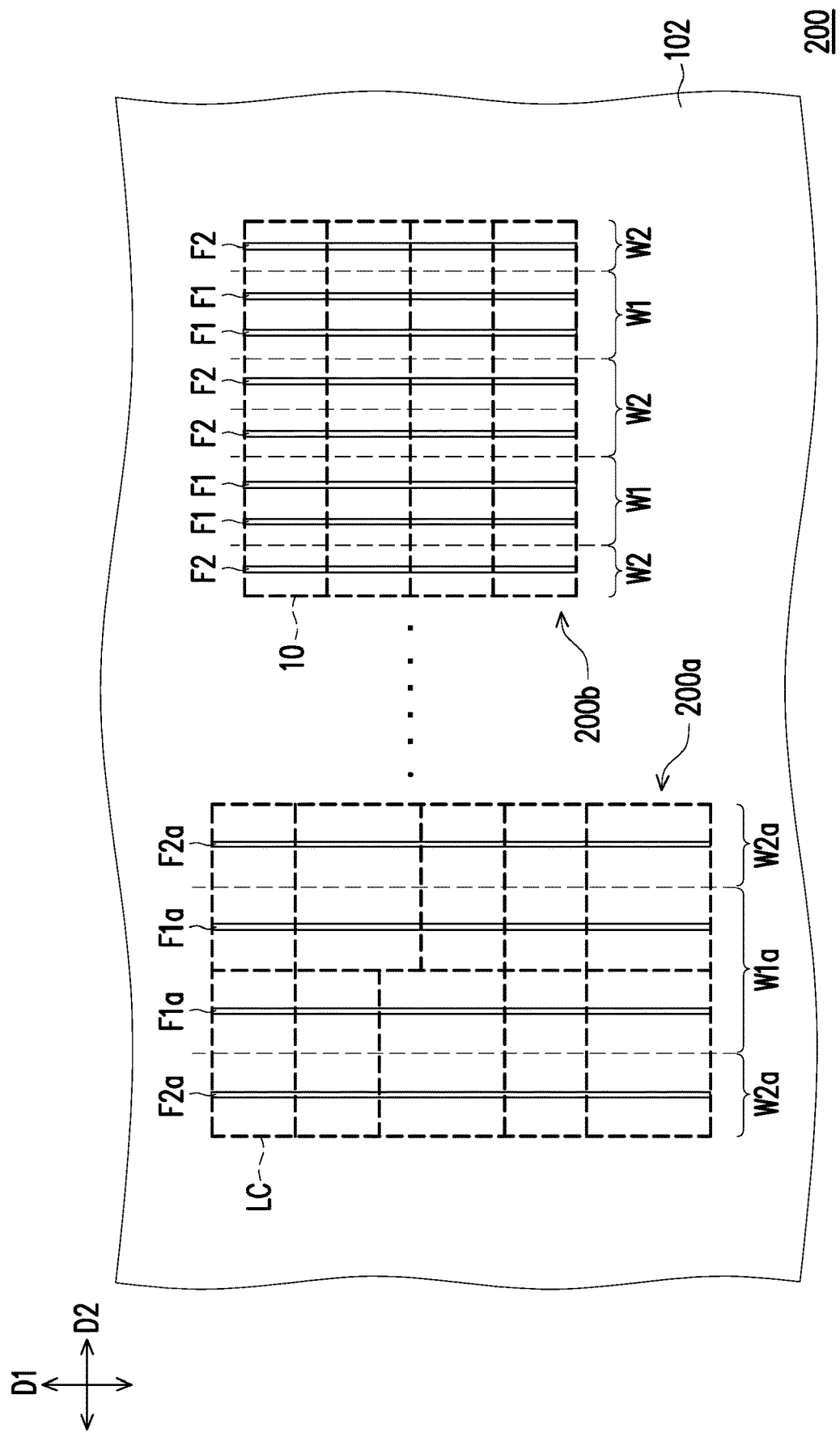
FIG. 5 is a schematic view of a semiconductor chip according to some embodiments.

FIG. 5 is a schematic view of a semiconductor chip 200 according to some embodiments.

Referring to FIG. 5, the semiconductor chip 200 includes a logic array 200a and a memory array 200b formed in and on the same substrate 102. The memory array 200b is similar to the memory array 100 described with reference to FIG. 1 through FIG. 4, and will not be described again. The logic array 200a has a plurality of first well regions W1a of the second conductive type (e.g., n-type) and second well regions W2a of the first conductive type (e.g., p-type) in the substrate 100. The first and second well regions W1a and W2a may be alternately arranged along the second direction D2. The logic array 200a includes a plurality of logic cells LC arranged along the first direction D1 and the second direction D2. Each of the logic cells LC may overlap with at least one of the first well region W1a and at least one of the second well region W2a, and includes a first active structure F1a. The first active structure F1a is located within one of the first well region W1a, and the first active structures F1a in adjacent logic cells LC are connected with each other to continuously extend across the logic array 200a along the first direction D1. The first active structure F1a is similar to the first active structure F1 described with reference to FIG. 2 through FIG. 4 that each has a strained portion (i.e. the top portion) and an underlying unstrained portion (i.e., the bottom portion).

In addition, each of the logic cells LC may further include a second fin structure F2a. The second active structure F2a is located within one of the second well region W2a, and the second active structures F2a in adjacent logic cells LC are connected with each other to continuously extend across the logic array 20a along the first direction D1. The second active structure F2a is similar to the second active structure F2 described with reference to FIG. 2 through FIG. 4 that is made of the unstrained semiconductor material. A plurality of gate patterns (not shown) may be formed over the first and second active structures F1a and F2a, so as to form a plurality of transistors of the first and second conductive types. These transistors may be electrically coupled to form at least one logic element including an inverter, a NAND gate, a NOR gate a flip-flop or a combination thereof.

As above, the active structures in the memory array according to some embodiments of the present disclosure are continuously extended across the memory array without being interrupted by isolation structure(s), as well as the active structures in the logic array. Thus, performance of the various transistors in the memory and logic arrays can be avoided from being influenced by the LOD effect or a poor control of an end shrink of the active structures. A manufacturing cost of the memory and logic arrays can be reduced since an additional patterning process on the active structures for forming the isolation structure(s) can be omitted. Moreover, an operating stability, a cell matching, a uniformity of the profile of the active structures, a SER performance and a latch up performance can be improved. Furthermore, a trapping frequency of the active structures can be expanded, which is helpful for saving an area of the memory array/logic array. On top of that, by applying a strained semiconductor material in the top portions of some active structures, a field effect mobility of the carriers in the transistors having channel regions in these active structures can be raised. As such, a driving ability of these transistors can be improved. Regarding the generation mechanism of the strain, continuity of the active structures having the strained portion is even more important than the active structures without a strained portion.

In some embodiments, the threshold voltage of the dummy transistors can be raised. As such, even during switching of the SRAM circuit, the dummy transistors can be avoided from being turned on. Therefore, a cross-talk between adjacent dummy transistors in adjacent memory cells can be avoided.

A memory array according to some embodiments of the present disclosure comprises a plurality of memory cells, each comprises: a first pull-up transistor and a first pull-down transistor, wherein a source/drain region of the first pull-up transistor is electrically coupled to a source/drain region of the first pull-down transistor at a first node; a second pull-up transistor and a second pull-down transistor, wherein a source/drain region of the second pull-up transistor is electrically coupled to a source/drain region of the second pull-down transistor at a second node, a gate structure of the second pull-up transistor and a gate structure of the second pull-down transistor are electrically coupled to the first node, a gate structure of the first pull-up transistor and a gate structure of the first pull-down transistor are electrically coupled to the second node; a first pass-gate transistor, electrically coupled to the first node; and a second pass-gate transistor, electrically coupled to the second node. The first pull-up transistor and the second pull-up transistor respectively comprise a first active structure, the first active structures are located over a substrate, the first active structures each has a bottom portion and a top portion over the bottom portion, the top portion comprises a strained semiconductor material, and the bottom portion comprises an unstrained semiconductor material. The first active structures continuously extend across the memory array.

In some embodiments, the bottom portions of the first active structures continuously extend across each of the plurality of memory cells along a first direction, and the top portions of the first active structure are discontinuous along the first direction within each of the plurality of memory cells. In some embodiments, source/drain regions of the first pull-up transistor are each located between adjacent segments of the top portion of one of the first active structures, and source/drain regions of the second pull-up transistor are each located between adjacent segments of the top portion of another one of the first active structures. In some embodiments, a doping concentration of the source/drain regions of the first pull-up transistor and a doping concentration of the source/drain regions of the second pull-up transistor are higher than a doping concentration of the top portions of the first active structures. In some embodiments, the first pull-up transistor and the second pull-up transistor are transistors of a first conductive type, and the first pull-down transistor, the second pull-down transistor, the first pass-gate transistor and the second pass-gate transistor are transistors of a second conductive type complementary to the first conductive type. In some embodiments, the first pull-down transistor and the first pass-gate transistor share a second active structure, the second pull-down transistor and the second pass-gate transistor share another second active structure, the second active structures comprise the unstrained semiconductor material. In some embodiments, each of the plurality of memory cells further comprises: a first dummy transistor, wherein a source/drain region of the first dummy transistor is electrically coupled to the first node; and a second dummy transistor, wherein a source/drain region of the second dummy transistor is electrically coupled to the second node. In some embodiments, the first pull-up transistor and the first dummy transistor share one of the first active structures, and the second pull-up transistor and the second dummy transistor share another one of the first active structures. In some embodiments, the first dummy transistor, the second dummy transistor, the first pull-up transistor and the second pull-up transistor are transistors of the same conductive type. In some embodiments, the source/drain of the first dummy transistor is electrically coupled to a gate of the first dummy transistor, and the source/drain of the second dummy transistor is electrically coupled to a gate of the second dummy transistor.

A memory array according to some embodiments of the present disclosure comprises a plurality of memory cells, each of the plurality of memory cells comprises: a first pull-up transistor and a first pull-down transistor, wherein a source/drain of the first pull-up transistor is electrically coupled to a source/drain of the first pull-down transistor at a first node; a second pull-up transistor and a second pull-down transistor, wherein a source/drain of the second pull-up transistor is electrically coupled to a source/drain of the second pull-down transistor at a second node, a gate of the second pull-up transistor and a gate of the second pull-down transistor are electrically coupled to the first node, a gate of the first pull-up transistor and a gate of the first pull-down transistor are electrically coupled to the second node; a first pass-gate transistor and a first dummy transistor, electrically coupled to the first node; and a second pass-gate transistor and a second dummy transistor, electrically coupled to the second node. The first dummy transistor, the second dummy transistor, the first pull-up transistor and the second pull-up transistor are transistors of the same conductive type, and a work function of gates of the first dummy transistor and the second dummy transistor is higher or lower than a work function of gates of the first pull-up transistor and the second pull-up transistor.

In some embodiments, the first pull-up transistor and the second pull-up transistor respectively comprise a first active structure over a substrate, and the first active structures continuously extend across the memory array. In some embodiments, the first dummy transistor, the second dummy transistor, the first pull-up transistor and the second pull-up transistor are p-type transistors, and the work function of the gates of the first dummy transistor and the second dummy transistors is higher than the work function of the gates of the first pull-up transistor and the second pull-up transistor. In some embodiments, the first pull-down transistor, the second pull-down transistor, the first pass-gate transistor and the second pass-gate transistor are n-type transistors, and the work function of the first dummy transistor and the second dummy transistor are substantially equal to a work function of gates of the n-type transistors. In some embodiments, the gates of the first pull-down transistor, the first pull-up transistor and the second dummy transistor are electrically connected with one another, the gates of the first dummy transistor, the second pull-up transistor and the second pull-down transistor are electrically connected with one another.

A semiconductor chip according to some embodiments of the present disclosure comprises: a logic array, comprising a plurality of logic cells, wherein each of the plurality of logic cells comprises a first active structure over a substrate, the first active structure has a bottom portion and a top portion over the bottom portion, the top portion of the first active structure comprises a strained semiconductor material, the bottom portion of the first active structure comprises an unstrained semiconductor material, and the first active structures of adjacent logic cells are connected with each other to continuously extend across the logic array; and a memory array, comprising a plurality of SRAM cells, wherein each of the plurality of SRAM cells comprises a second active structure over the substrate, the second active structure has a bottom portion and a top portion over the bottom portion, the top portion of the second active structure comprises a strained semiconductor material, the bottom portion of the second active structure comprises an unstrained semiconductor material, and the second active structures of adjacent SRAM cells are connected with each other to continuously extend across the memory array.

In some embodiments, each of the plurality of logic cells comprises a logic element comprising an inverter, a NAND gate, a NOR gate, a flip-flop or a combination thereof. In some embodiments, the first active structure and the second active structure are of the same conductive type. In some embodiments each of the plurality of logic cells comprises and each of the plurality of SRAM cells respectively comprises an active structure made of an unstrained semiconductor material. In some embodiments, a conductive type of the active structures is complementary to a conductive type of the first active structures and the second active structures.

The foregoing outlines features of several embodiments so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:

1. A memory array, comprising a plurality of memory cells, each of the plurality of memory cells comprises:
   a first pull-up transistor and a first pull-down transistor, wherein a source/drain region of the first pull-up transistor is electrically coupled to a source/drain region of the first pull-down transistor at a first node;
   a second pull-up transistor and a second pull-down transistor, wherein a source/drain region of the second pull-up transistor is electrically coupled to a source/drain region of the second pull-down transistor at a second node, a gate structure of the second pull-up transistor and a gate structure of the second pull-down transistor are electrically coupled to the first node, a gate structure of the first pull-up transistor and a gate structure of the first pull-down transistor are electrically coupled to the second node;
   a first pass-gate transistor, electrically coupled to the first node; and
   a second pass-gate transistor, electrically coupled to the second node,
   wherein the first pull-up transistor and the second pull-up transistor respectively comprise a first active structure, the first active structures are located over a substrate, the first active structures each has a bottom portion and a top portion over the bottom portion, the top portion comprises a strained semiconductor material, and the bottom portion comprises an unstrained semiconductor material, and
   wherein the first active structures continuously extend across the memory array.

2. The memory array of claim 1, wherein the bottom portions of the first active structures continuously extend across each of the plurality of memory cells along a first direction, and the top portions of the first active structure are discontinuous along the first direction within each of the plurality of memory cells.

3. The memory array of claim 2, wherein source/drain regions of the first pull-up transistor are each located between adjacent segments of the top portion of one of the first active structures, and source/drain regions of the second pull-up transistor are each located between adjacent segments of the top portion of another one of the first active structures.

4. The memory array of claim 1, wherein a doping concentration of the source/drain regions of the first pull-up transistor and a doping concentration of the source/drain regions of the second pull-up transistor are higher than a doping concentration of the top portions of the first active structures.

5. The memory array of claim 1, wherein the first pull-up transistor and the second pull-up transistor are transistors of a first conductive type, and the first pull-down transistor, the second pull-down transistor, the first pass-gate transistor and the second pass-gate transistor are transistors of a second conductive type complementary to the first conductive type.

6. The memory array of claim 1, wherein the first pull-down transistor and the first pass-gate transistor share a second active structure, the second pull-down transistor and the second pass-gate transistor share another second active structure, the second active structures comprise the unstrained semiconductor material.

7. The memory array of claim 1, wherein each of the plurality of memory cells further comprises:
   a first dummy transistor, wherein a source/drain region of the first dummy transistor is electrically coupled to the first node; and
   a second dummy transistor, wherein a source/drain region of the second dummy transistor is electrically coupled to the second node.

8. The memory array of claim 7, wherein the first pull-up transistor and the first dummy transistor share one of the first active structures, and the second pull-up transistor and the second dummy transistor share another one of the first active structures.

9. The memory array of claim 7, wherein the first dummy transistor, the second dummy transistor, the first pull-up transistor and the second pull-up transistor are transistors of the same conductive type.

10. The memory array of claim 7, wherein the source/drain of the first dummy transistor is electrically coupled to a gate of the first dummy transistor, and the source/drain of the second dummy transistor is electrically coupled to a gate of the second dummy transistor.

11. A memory array, comprising a plurality of memory cells, each of the plurality of memory cells comprises:
a first pull-up transistor and a first pull-down transistor, wherein a source/drain of the first pull-up transistor is electrically coupled to a source/drain of the first pull-down transistor at a first node;
a second pull-up transistor and a second pull-down transistor, wherein a source/drain of the second pull-up transistor is electrically coupled to a source/drain of the second pull-down transistor at a second node, a gate of the second pull-up transistor and a gate of the second pull-down transistor are electrically coupled to the first node, a gate of the first pull-up transistor and a gate of the first pull-down transistor are electrically coupled to the second node;
a first pass-gate transistor and a first dummy transistor, electrically coupled to the first node; and
a second pass-gate transistor and a second dummy transistor, electrically coupled to the second node,
wherein the first dummy transistor, the second dummy transistor, the first pull-up transistor and the second pull-up transistor are transistors of the same conductive type, and a work function of gates of the first dummy transistor and the second dummy transistor is higher or lower than a work function of gates of the first pull-up transistor and the second pull-up transistor.

12. The memory array of claim 11, wherein the first pull-up transistor and the second pull-up transistor respectively comprise a first active structure over a substrate, and the first active structures continuously extend across the memory array.

13. The memory array of claim 11, wherein the first dummy transistor, the second dummy transistor, the first pull-up transistor and the second pull-up transistor are p-type transistors, and the work function of the gates of the first dummy transistor and the second dummy transistors is higher than the work function of the gates of the first pull-up transistor and the second pull-up transistor.

14. The memory array of claim 13, wherein the first pull-down transistor, the second pull-down transistor, the first pass-gate transistor and the second pass-gate transistor are n-type transistors, and the work function of the first dummy transistor and the second dummy transistor are substantially equal to a work function of gates of the n-type transistors.

15. The memory array of claim 11, wherein the gates of the first pull-down transistor, the first pull-up transistor and the second dummy transistor are electrically connected with one another, the gates of the first dummy transistor, the second pull-up transistor and the second pull-down transistor are electrically connected with one another.

16. A semiconductor chip, comprising:
a logic array, comprising a plurality of logic cells, wherein each of the plurality of logic cells comprises a first active structure over a substrate, the first active structure has a bottom portion and a top portion over the bottom portion, the top portion of the first active structure comprises a strained semiconductor material, the bottom portion of the first active structure comprises an unstained semiconductor material, and the first active structures of adjacent logic cells are connected with each other to continuously extend across the logic array; and
a memory array, comprising a plurality of SRAM cells, wherein each of the plurality of SRAM cells comprises a second active structure over the substrate, the second active structure has a bottom portion and a top portion over the bottom portion, the top portion of the second active structure comprises a strained semiconductor material, the bottom portion of the second active structure comprises an unstrained semiconductor material, and the second active structures of adjacent SRAM cells are connected with each other to continuously extend across the memory array.

17. The semiconductor chip of claim 16, wherein each of the plurality of logic cells comprises a logic element comprising an inverter, a NAND gate, a NOR gate, a flip-flop or a combination thereof.

18. The semiconductor chip of claim 16, wherein the first active structure and the second active structure are of the same conductive type.

19. The semiconductor chip of claim 16, wherein each of the plurality of logic cells comprises and each of the plurality of SRAM cells respectively comprises an active structure made of an unstrained semiconductor material.

20. The semiconductor chip of claim 19, wherein a conductive type of the active structures is complementary to a conductive type of the first active structures and the second active structures.

* * * * *